United States Patent
Wu

(10) Patent No.: US 7,259,597 B2
(45) Date of Patent: Aug. 21, 2007

(54) LOW-VOLTAGE DETECTION CIRCUIT

(75) Inventor: Li-Te Wu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 83 days.

(21) Appl. No.: 11/165,648

(22) Filed: Jun. 23, 2005

(65) Prior Publication Data
US 2006/0152250 A1    Jul. 13, 2006

(30) Foreign Application Priority Data
Jan. 7, 2005 (TW) ............... 94100438 A

(51) Int. Cl.
*H03K 5/22* (2006.01)
(52) U.S. Cl. .......................... 327/78; 327/79
(58) Field of Classification Search ............ 327/78, 327/79, 143; 320/136
See application file for complete search history.

(56) References Cited

U.S. PATENT DOCUMENTS

| | | | | |
|---|---|---|---|---|
| 4,309,627 A | * | 1/1982 | Tabata | .......................... 327/81 |
| 4,665,370 A | * | 5/1987 | Holland | ...................... 324/429 |
| 4,709,320 A | | 11/1987 | Konopka | ................. 363/56.01 |
| 5,440,254 A | | 8/1995 | Sundby | ....................... 327/79 |
| 5,610,506 A | * | 3/1997 | McIntyre | ..................... 323/313 |
| 6,147,521 A | * | 11/2000 | Degoirat et al. | ............... 327/81 |
| 6,373,256 B1 | * | 4/2002 | Hanjani et al. | ............. 324/433 |
| 6,936,998 B2 | * | 8/2005 | Cho | ............................ 323/280 |
| 7,030,668 B1 | * | 4/2006 | Edwards | ..................... 327/143 |
| 2002/0140402 A1 | * | 10/2002 | Sudo | .......................... 320/149 |

* cited by examiner

*Primary Examiner*—Kenneth B. Wells
(74) *Attorney, Agent, or Firm*—J.C. Patents

(57) ABSTRACT

A low-voltage detection circuit detects a terminal voltage of a power supply terminal. The low-voltage detection circuit includes a first voltage-dividing circuit, a second voltage-dividing circuit, and a comparator. The second voltage-dividing circuit includes a bias circuit and a metal-oxide-semiconductor (MOS) transistor. The comparator compares and receives a voltage generated by the first voltage-dividing circuit and a voltage generated by the second voltage-dividing circuit to generate a voltage detection signal.

18 Claims, 1 Drawing Sheet

LOW-VOLTAGE DETECTION CIRCUIT

CROSS-REFERENCE TO RELATED APPLICATION

This application claims the priority benefit of Taiwan application serial no. 94100438, filed on Jan. 7, 2005. All disclosure of the Taiwan application is incorporated herein by reference.

BACKGROUND OF THE INVENTION

1. Field of the Invention

The present invention relates to a voltage detection circuit, and more particularly to a low-voltage detection circuit capable of precisely measuring a voltage.

2. Description of the Related Art

With the advance of technology, hand-held electronic apparatuses, such as electronic dictionaries, cellular phones, walkmans, or digital cameras, which are driven by low voltages, have become commonplace in our daily lives. The power of integrated circuits of the electronic apparatus is supplied by batteries. However, the power capacity of batteries is limited. Therefore, users must pay attention as to when the power is running out and when the battery needs to be replaced or charged. For that purpose, a low-voltage detection circuit is required.

FIG. 1 is a circuit showing a conventional low-voltage detection apparatus. Referring to FIG. 1, the conventional low-voltage detection apparatus comprises a reference voltage source 101, a bias voltage circuit 105, and a comparator 102. The reference voltage source 101 is a band-gap reference apparatus. The apparatus has a low temperature coefficient. That is, the output reference voltage Vref does not vary with the temperature. The bias circuit 105 comprises resistors R111 and R112, and divides the terminal voltage Vdd, which is coupled to the power supply terminal, into the voltage Vdiv. The voltage Vdiv, therefore, is Vdd×R112/(R111+R112).

The comparator 102 receives and compares the divided voltage Vdiv of the terminal voltage Vdd, and the reference voltage Vref between the negative input terminal and the positive input terminal. When the divided voltage Vdiv is larger than the reference voltage Vref, the voltage Vdd should be larger than, or equal to the ideal threshold voltage of the to-be-tested integrated circuit (not shown). As a result, the to-be-tested integrated circuit (not shown) is enabled. The comparator 102 then outputs the voltage detection signal 130 with logic 0 such that the to-be-tested integrated circuit (not shown) starts operation.

On the contrary, when the divided voltage Vdiv is smaller than the reference voltage Vref, the voltage Vdd should be smaller than the ideal threshold voltage of the to-be-tested integrated circuit (not shown). As a result, the to-be-tested integrated circuit (not shown) cannot stably operate under such voltage. The comparator 102 then outputs the voltage detection signal 130 with logic 1 to turn off the to-be-tested integrated circuit (not shown), or to inform the user to change the battery.

The conventional low-voltage detection circuit, however, has two disadvantages:

1. The band-gap reference apparatus of the low-voltage detection circuit must operate with a reference voltage source higher than 1.25 V. If the operational voltage is equal to, or smaller than 1.24 V, the circuit cannot normally operate. Accordingly, the conventional low-voltage detection circuit cannot operate under the voltage lower than 1.24 V.

2. Present integrated circuits are formed by the metal-oxide-semiconductor (MOS). The operation of MOS transistor will be affected by the variation of the process or with different manufacturing dates. Integrated circuits which are formed by different processes and with different manufacturing dates would require different operational voltages and have different threshold voltages. The reference voltage Vref uses the threshold voltage of the worst integrated circuit as a standard.

For example, the operational voltage of a MOS-made integrated circuit is between 2.4 V to 5 V. However, in the integrated circuits formed in the same manufacturing process, but in different dates, the operational voltage of the best integrated circuit is between 2.0 V to 5 V, but the operational voltage of the worst integrated circuit is between 2.8 V and 5 V.

In order for these integrated circuits to operate in a stable condition, the ideal terminal voltage Vdd for each integrated circuit should be higher than 2.8 V. The reference voltage Vref will also vary with the minimum terminal voltage Vdd. The best integrated circuit would warn the user of changing the battery and the integrated circuit would stop operation, when the terminal voltage is lower than 2.8 V, rather than when the terminal voltage is lower than 2.0 V. Accordingly, 0.8 V is wasted.

SUMMARY OF THE INVENTION

Accordingly, the present invention is directed to a low-voltage detection circuit for improving the utility rate of the power source. By reducing the operational voltage of the low-voltage detection circuit, the circuit can still operate normally under low voltage.

The present invention provides a low-voltage detection circuit to detect a terminal voltage of a power supply terminal. The low-voltage detection circuit comprises a first voltage-dividing circuit, a second voltage-dividing circuit, and a comparator. The first voltage-dividing circuit is coupled to the power supply terminal to divide the terminal voltage into a first compare voltage. The second voltage-dividing circuit comprises a bias circuit and a metal-oxide-semiconductor (MOS) transistor. The second voltage-dividing circuit is coupled to the power supply terminal to divide the terminal voltage into a second compare voltage. The comparator receives and compares the first compare voltage and the second compare voltage to generate a voltage detection signal.

According to the low-voltage detection circuit of an embodiment of the present invention, the first voltage-dividing circuit comprises a first resistor, a second resistor, and a third resistor. A terminal of the first resistor is coupled to the power supply terminal. A terminal of the second resistor is coupled to another terminal of the first resistor, and anther terminal of the second resistor is coupled to the comparator and a terminal of the third resistor. Another terminal of the third resistor is grounded.

According to the low-voltage detection circuit of an embodiment of the present invention, the bias circuit of the second voltage-dividing circuit comprises a fourth resistor and a fifth resistor. A terminal of the fourth resistor is coupled to the power supply terminal, and another terminal of the fourth resistor is coupled to the MOS transistor. A terminal of the fifth resistor is coupled to the MOS transistor and the comparator, and another terminal of the fifth resistor is grounded. Wherein, a resistance of the first resistor of the first voltage-dividing circuit is equal to a resistance of the fourth resistor, and a resistance of the third resistor of the first voltage-dividing circuit is equal to a resistance of the fifth resistor.

According to the low-voltage detection circuit of an embodiment of the present invention, the second voltage-dividing circuit comprises a fourth resistor and a fifth resistor. A terminal of the fourth resistor is coupled to the power supply terminal, and another terminal of the fourth resistor is coupled to the MOS transistor. A terminal of the fifth resistor is coupled to the MOS transistor and the comparator, and another terminal of the fifth resistor is grounded.

According to the low-voltage detection circuit of an embodiment of the present invention, the first voltage-dividing circuit comprises a first resistor, a second resistor, and a third resistor. A terminal of the first resistor is coupled to the power supply terminal, and another terminal of the first resistor is coupled to the second resistor. Another terminal of the second resistor is coupled to the comparator and the third resistor. Another terminal of the third resistor is grounded. Wherein, a resistance of the first resistor is equal to a resistance of the fourth resistor of the second voltage-dividing circuit, and a resistance of the third resistor is equal to a resistance of the fifth resistor of the second voltage-dividing circuit.

According to the low-voltage detection circuit of an embodiment of the present invention, if the terminal voltage is higher than a threshold voltage of the MOS transistor of the second voltage-dividing circuit, a transmission resistance of the MOS transistor is smaller. On the other hand, if the terminal voltage is lower than a threshold voltage of the MOS transistor of the second voltage-dividing circuit, a transmission resistance of the MOS transistor is larger.

According to the low-voltage detection circuit of an embodiment of the present invention, if the first compare voltage is higher than the second compare voltage which is measured by the comparator, the voltage detection signal is logic 1. If the first compare voltage is lower than, or equal to the second compare voltage, which is measured by the comparator, the voltage detection signal is logic 0.

According to the low-voltage detection circuit of an embodiment of the present invention, the MOS transistor of the second bias voltage circuit is disposed in a to-be-tested integrated circuit.

In the present invention, the MOS transistor of the to-be-tested circuit is used to measure the minimum operational voltage of the to-be-tested circuit. Without the influence of the fabricating process of the MOS transistor, the present invention can improve the utility rate of the battery. In addition, the low-voltage detection circuit does not have a specific operational voltage. As a result, the integrated circuit can effectively operate under the minimum operational voltage. For hand-held integrated circuits and other low-voltage integrated circuits, the efficiency of power can be improved.

The above and other features of the present invention will be better understood from the following detailed description of the preferred embodiments of the invention that is provided in communication with the accompanying drawings.

DESCRIPTION OF SOME EMBODIMENTS

The reference power source of the conventional low-voltage detection circuit has a specific operational voltage and the low-voltage detection circuit cannot operate under a voltage lower than that. With the fabricating process of the metal-oxide-semiconductor (MOS) transistor, though some integrated circuits can operate normally under a low voltage, the specific reference voltage would waste the power of the battery. Accordingly, the present invention uses the MOS transistor of the to-be-tested integrated circuit to test the operational voltage. The minimum operational voltage of each circuit can be determined based on the fabrication process. Thus, the efficiency of the battery can be improved. Without a specific operational voltage, the detection circuit of the present invention and the to-be-tested integrated circuit can both operate under the minimum operational voltage.

Figure 1:
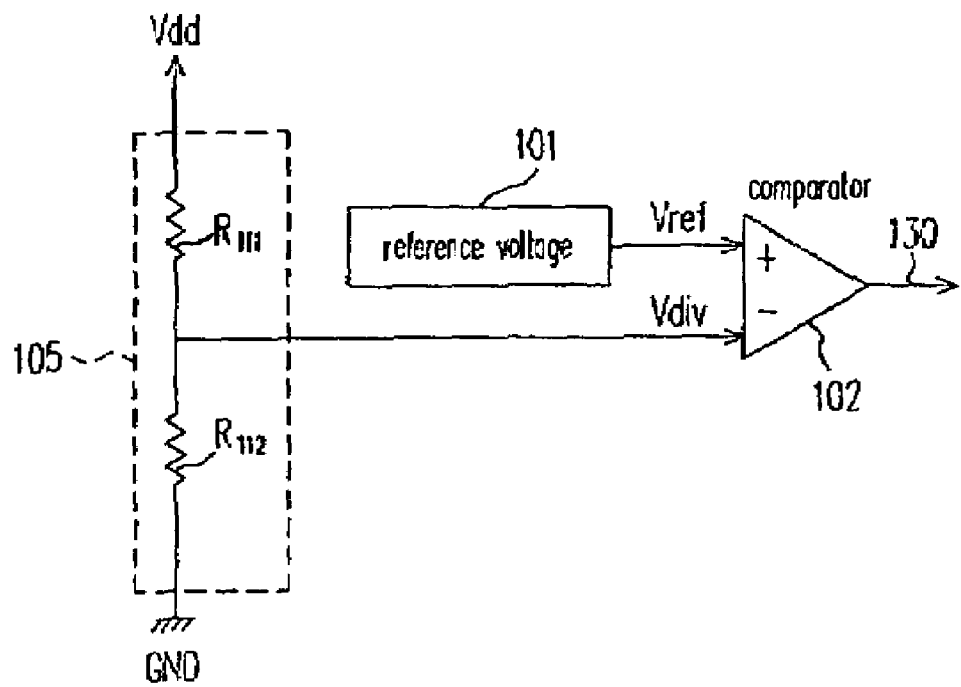
FIG. 1 is a circuit showing a conventional low-voltage detection apparatus.
Figure 2:
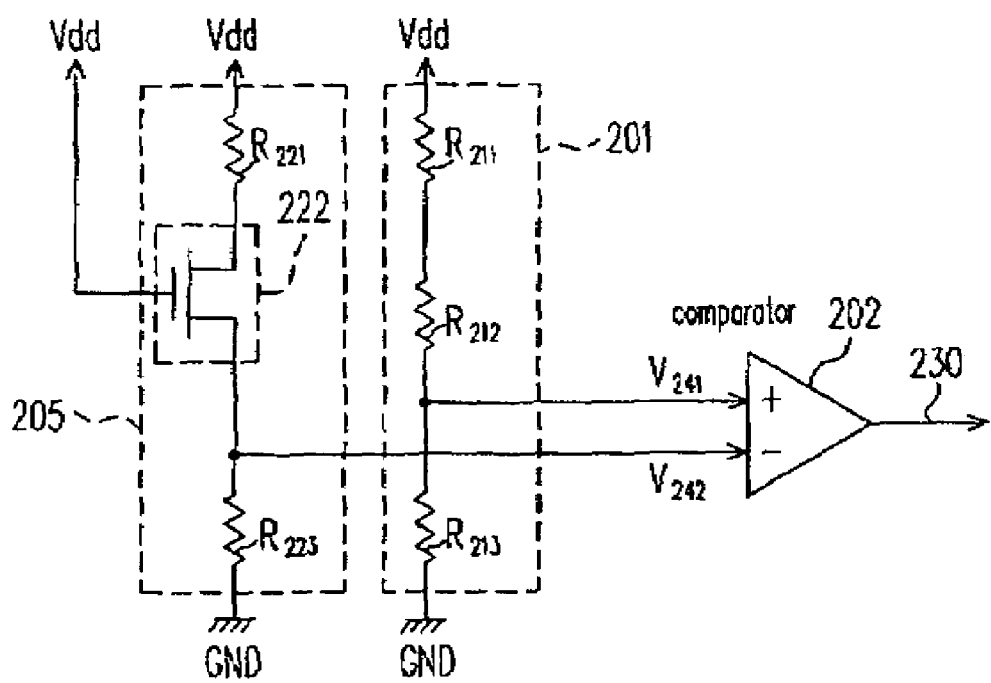
FIG. 2 is a schematic circuit drawing showing a low-voltage detection circuit of an embodiment of the present invention.

The following is an embodiment of the present invention. FIG. 2 is a schematic circuit drawing showing a low-voltage detection circuit of an embodiment of the present invention. The low-voltage detection circuit comprises a first voltage-dividing circuit 201, a comparator 202, and a second voltage-dividing circuit 205. The first voltage-dividing circuit 201 comprises resistors R211, R212, and R213. A terminal of the resistor R211 is coupled to a terminal voltage Vdd. Another terminal of the resistor R211 is coupled to the resistor R212. The resistor R212 is coupled to a positive input terminal of the comparator 202 and the resistor R213. Another terminal of the resistor R213 is coupled to another terminal voltage. To simplify the embodiment, another terminal of the resistor R213 is grounded. Accordingly, the terminal voltage Vdd is divided into the first compare voltage $V241=Vdd \times R213/(R211+R212+R213)$.

The second voltage-dividing circuit 205 comprises a resistor R221, a MOS transistor 222, and a resistor R223. In this embodiment, the MOS transistor is an NMOS transistor. The gate G of the NMOS transistor 222 is coupled to the terminal voltage Vdd. The source S of the NMOS transistor 222 is coupled to the resistor 221. The drain D of the NMOS transistor 222 is coupled to the resistor 223, and the negative input terminal of the comparator 202.

Another terminal of the resistor R221 is coupled to the terminal voltage Vdd. Another terminal of the resistor R223 is coupled to another terminal voltage as the resistor R213 of the first bias circuit 201. To simplify the embodiment, another terminal of the resistor R223 is grounded. The resistors R221 and R223 enable the NMOS transistor 222 to operate under the active mode, and can be regarded as the bias circuit of the NMOS transistor 222. In addition, the resistance of the resistor R221 is similar to that of the resistor R211, and the resistance of the resistor R223 is similar to that of the resistor R213 in this embodiment.

In this embodiment, the NMOS transistor 222 is a MOS transistor disposed in the to-be-tested integrated circuit. It can be a representative MOS transistor selected from the integrated circuit to detect the transmission current of the MOS transistor. In the present invention, the transmission current of the MOS transistor is used to determine if the integrated circuit (not shown) can normally operate, because the transmission current of the MOS transistor is closely related to the operation of the integrated circuit. The NMOS transistor 222 comprises a transmission resistor R222 (not shown), which is disposed in the NMOS transistor 222. Accordingly, the second voltage-dividing circuit 205 can divide the terminal voltage Vdd into a second compare voltage V242=Vdd×R223/(R221+R222+R223).

In this embodiment, an operational amplifier serves as the comparator 202. The positive input terminal of the operational amplifier 202 is coupled to the first compare voltage V241, and the negative input terminal of the operational amplifier 202 is coupled to the second compare voltage V242. Accordingly, the voltage detection circuit 230 is formed to compare these two compare voltages. Because the resistors R221 and R211 have the same resistance, and the resistors R223 and R213 have the same resistance, the resistance of the resistor R212 and the transmission resistor R222 of the NMOS transistor 222 should be determined before the first compare voltage V241 and the second compare voltage V242 are compared. In this embodiment, the operational voltage of the terminal voltage Vdd is kept lower, and the source and the gate are coupled to the terminal voltage Vdd, therefore the NMOS transistor 222 is maintained in the saturation region. $V_{GS}$ and $V_{DS}$ are Vdd−0=Vdd. The current flowing from the source to the gate of the NMOS transistor 222 is given by:

$$I_{DS} = k\left(\frac{W}{L}\right)(Vdd - V_T)^2$$

wherein, k, W, and L represent process factors, and $V_T$ represents the threshold voltage of the NMOS transistor 222. The resistance of the transmission resistor R222 is given by:

$$R222 = \frac{Vdd}{I_{DS}} = \frac{Vdd}{k\left(\frac{W}{L}\right)(Vdd - V_T)^2}$$

According to the formula of the transmission resistor R222 of the NMOS transistor 222, if the terminal voltage Vdd is higher than the threshold voltage of the NMOS transistor 222 of the second voltage-dividing circuit 205, the resistance of the transmission resistor R222 of the NMOS transistor 222 is small, about 100 Ω. However, if the terminal voltage Vdd is lower than the threshold voltage of the NMOS transistor 222 of the second voltage-dividing circuit 205, the resistance of the transmission resistor R222 is large, about 1.5 kΩ. Accordingly, when the terminal voltage Vdd is close to the threshold voltage of the NMOS transistor 222, the resistance of the transmission resistor R222 varies drastically. The resistance of the resistor R212 of the first voltage-dividing circuit 201 can be a desired resistance selected from 100 Ω and 1.5 kΩ.

Accordingly, when the resistance of the transmission resistor R222 is higher than that of the resistor R212, the transmission current of the NMOS transistor 222 is reduced. It can be determined that the first compare voltage V241 is larger than the second compare voltage V242. The operational amplifier 202 serving as the comparator outputs the logic 1 to inform the stand-by integrated circuit or the user that the power is running out, and the battery needs to be charged or replaced.

When the resistance of the transmission resistor R222 is smaller than that of the resistor R212, the transmission current of the NMOS transistor 222 is normal. It can be determined that the first compare voltage V241 is lower than, or equal to the second compare voltage V242. The operational amplifier 202 serving as the comparator outputs the logic 0 to inform the stand-by integrated circuit or the user that the power is sufficient enough to drive the circuit.

Accordingly, the MOS transistor of the to-be-tested circuit of the present invention is used to test the minimum operational voltage of the to-be-tested circuit. Without the influence of the fabricating process of the MOS transistor, the present invention can improve the utility rate of the battery. In addition, the low-voltage detection circuit does not have a specific operational voltage. As a result, the integrated circuit can effectively operate under the minimum operational voltage. For hand-held integrated circuits and other low-voltage integrated circuits, the efficiency of power can be improved.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A low-voltage detection circuit to detect a terminal voltage of a power supply terminal, comprising:
   a first voltage-dividing circuit coupled to the power supply terminal to divide the terminal voltage into a first compare voltage;
   a second voltage-dividing circuit comprising a bias circuit and a metal-oxide-semiconductor (MOS) transistor, the second voltage-dividing circuit being coupled to the power supply terminal to divide the terminal voltage into a second compare voltage, wherein a gate of the MOS transistor receives the terminal voltage; and
   a comparator receiving and comparing the first compare voltage and the second compare voltage to generate a voltage detection signal.

2. The low-voltage detection circuit of claim 1, wherein the first voltage-dividing circuit comprises:
   a first resistor, a terminal of the first resistor being coupled to the power supply terminal;
   a second resistor, a terminal of the second resistor being coupled to another terminal of the first resistor, another terminal of the second resistor being coupled to the comparator; and
   a third resistor, a terminal of the third resistor being coupled to the another terminal of the second resistor, another terminal of the third resistor being grounded.

3. The low-voltage detection circuit of claim 2, wherein the bias circuit of the second voltage-dividing circuit comprises:
   a fourth resistor, a terminal of the fourth resistor being coupled to the power supply terminal, another terminal of the fourth resistor being coupled to the MOS transistor; and
   a fifth resistor, a terminal of the fifth resistor being coupled to the MOS transistor and the comparator, another terminal of the fifth resistor being grounded.

4. The low-voltage detection circuit of claim 1, wherein the second voltage-dividing circuit comprises:
   a first resistor, a terminal of the first resistor being coupled to the power supply terminal, another terminal of the first resistor being coupled to the MOS transistor; and
   a second resistor, a terminal of the second resistor being coupled to the MOS transistor and the comparator, another terminal of the second resistor being grounded.

5. The low-voltage detection circuit of claim 3, characterized in that:
a resistance of the first resistor is equal to a resistance of the fourth resistor; and
a resistance of the third resistor is equal to a resistance of the fifth resistor.

6. The low-voltage detection circuit of claim 1, wherein if the terminal voltage is higher than a threshold voltage of the MOS transistor of the second voltage-dividing circuit, a transmission resistance of the MOS transistor is a first value; if the terminal voltage is lower than a threshold voltage of the MOS transistor of the second voltage-dividing circuit, a transmission resistance of the MOS transistor is a second value, wherein the first value is smaller than the second value.

7. The low-voltage detection circuit of claim 1, wherein the MOS transistor is disposed in a to-be-tested integrated circuit.

8. The low-voltage detection circuit of claim 1, wherein if the first compare voltage is higher than the second compare voltage, which is measured by the comparator, the voltage detection signal is logic 1.

9. The low-voltage detection circuit of claim 1, wherein if the first compare voltage is lower than, or equal to the second compare voltage, which is measured by the comparator, the voltage detection signal is logic 0.

10. A low-voltage detection circuit for detecting a first terminal voltage of a first power supply terminal and a second terminal voltage of a second power supply terminal; comprising:
a first voltage-dividing circuit coupled to the first power supply terminal and the second power supply terminal to divide the first terminal voltage and the second terminal voltage into a first compare voltage;
a second voltage-dividing circuit comprising a bias circuit and a metal-oxide-semiconductor (MOS) transistor, the second voltage-dividing circuit being coupled to the first power supply terminal and the second power supply terminal to divide the first terminal voltage and the second terminal voltage into a second compare voltage, wherein a gate of the MOS transistor receives the terminal voltage; and
a comparator, receiving and comparing the first compare voltage and the second compare voltage to generate a voltage detection signal.

11. The low-voltage detection circuit of claim 10, wherein the first voltage-dividing circuit comprises:
a first resistor, a terminal of the first resistor being coupled to the first power supply terminal;
a second resistor, a terminal of the second resistor being coupled to another terminal of the first resistor, another terminal of the second resistor being coupled to the comparator; and
a third resistor, a terminal of the third resistor being coupled to the another terminal of the second resistor, another terminal of the third resistor being coupled to the second power supply terminal.

12. The low-voltage detection circuit of claim 11, wherein the bias circuit of the second voltage-dividing circuit comprises:
a fourth resistor, a terminal of the fourth resistor being coupled to the first power supply terminal, another terminal of the fourth resistor being coupled to the MOS transistor; and
a fifth resistor, a terminal of the fifth resistor being coupled to the MOS transistor and the comparator, another terminal of the fifth resistor being coupled to the second power supply terminal.

13. The low-voltage detection circuit of claim 10, wherein the second voltage-dividing circuit comprises:
a first resistor, a terminal of the first resistor being coupled to the first power supply terminal, another terminal of the first resistor being coupled to the MOS transistor; and
a second resistor, a terminal of the second resistor being coupled to the MOS transistor and the comparator, another terminal of the second resistor being coupled to the second power supply terminal.

14. The low-voltage detection circuit of claim 12, characterized in that:
a resistance of the first resistor is equal to a resistance of the fourth resistor; and
a resistance of the third resistor is equal to a resistance of the fifth resistor.

15. The low-voltage detection circuit of claim 10, wherein if the sum of the first terminal voltage and the second terminal voltage is higher than a threshold voltage of the MOS transistor of the second voltage-dividing circuit, a transmission resistance of the MOS transistor is a first value; if the sum of the first terminal voltage and the second terminal voltage are lower than a threshold voltage of the MOS transistor of the second voltage-dividing circuit, a transmission resistance of the MOS transistor is a second value, wherein the first value is smaller than the second value.

16. The low-voltage detection circuit of claim 10, wherein if the first compare voltage is higher than the second compare voltage, which is measured by the comparator, the voltage detection signal is logic 1.

17. The low-voltage detection circuit of claim 10, wherein if the first compare voltage is lower than, or equal to the second compare voltage, which is measured by the comparator, the voltage detection signal is logic 0.

18. The low-voltage detection circuit of claim 10, wherein the MOS transistor is disposed in a to-be-tested integrated circuit.

* * * * *